United States Patent [19]

Klaassen

[11] 4,390,911
[45] Jun. 28, 1983

[54] SIGNAL SEPARATION IN MAGNETIC RECORDING USING BURIED SERVO

[75] Inventor: Klaas B. Klaassen, 's Gravenzande, Netherlands

[73] Assignee: International Business Machines Corporation, Armonk, N.Y.

[21] Appl. No.: 259,269

[22] Filed: Apr. 30, 1981

[51] Int. Cl.³ .............................................. G11B 21/10
[52] U.S. Cl. ...................................... 360/77; 360/18; 360/62
[58] Field of Search ...................... 360/70, 75, 77, 78, 360/60–62, 109, 66–68, 18

[56] References Cited
U.S. PATENT DOCUMENTS

| | | | |
|---|---|---|---|
| 3,404,392 | 10/1968 | Sordello | 360/77 |
| 3,480,739 | 11/1969 | Kinkel | 360/66 |
| 4,110,799 | 8/1978 | Bergmans et al. | 360/70 |
| 4,313,140 | 1/1982 | Keidl | 360/77 |
| 4,333,114 | 6/1982 | Ohta | 360/68 X |

Primary Examiner—John H. Wolff
Attorney, Agent, or Firm—Walter J. Madden, Jr.

[57] ABSTRACT

A servo system provides track following servo information from a buried servo layer disposed under the data recording layer, using the same transducer for simultaneously reading the servo information and writing data. To prevent the voltage generated in the transducer while writing data from masking out the servo information, a dummy voltage having the same magnitude as the transducer voltage is connected so that it cancels the write data voltage in the head.

7 Claims, 6 Drawing Figures

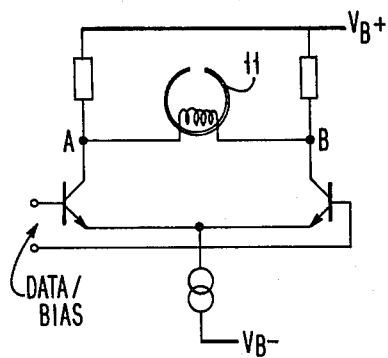
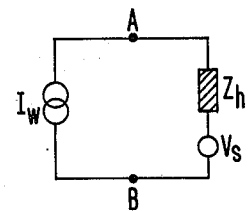
PRIOR ART
FIG. 1A         FIG. 1B
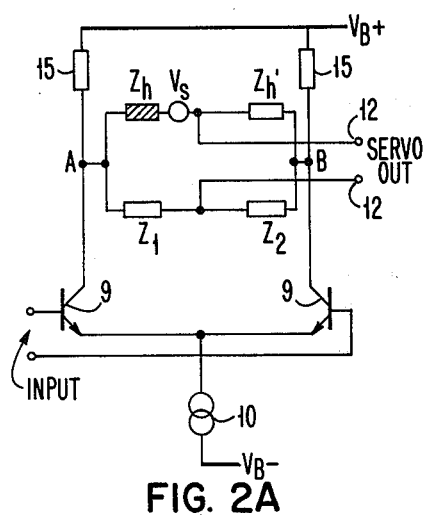
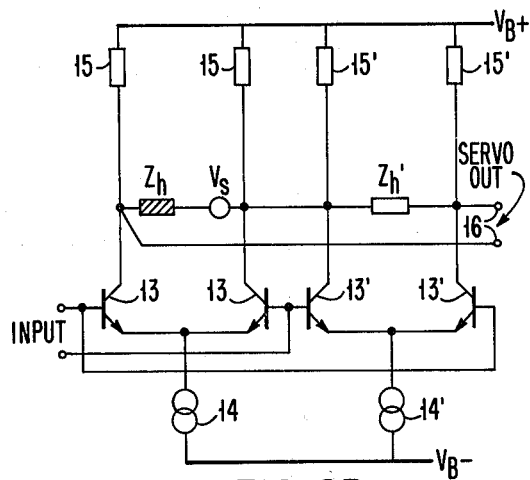
FIG. 2A         FIG. 2B
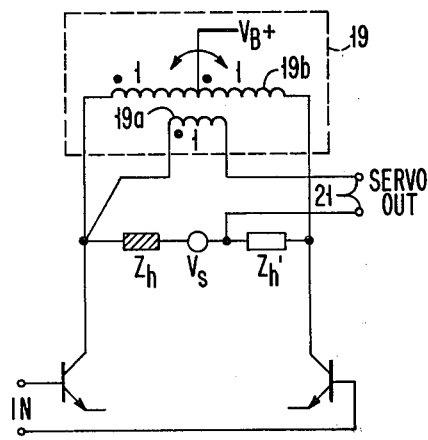
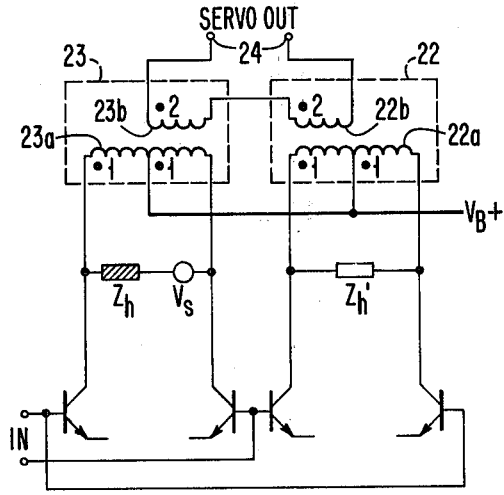
FIG. 3A         FIG. 3B

SIGNAL SEPARATION IN MAGNETIC RECORDING USING BURIED SERVO

TECHNICAL FIELD

This invention relates to a servo system and more particularly to a track following servo system for positioning a transducer at a desired track location on a magnetic recording medium.

BACKGROUND ART

In disk-type random access magnetic memories where data is recorded in concentric circular tracks on the surfaces of disks, it is a continuing aim to accurately align a magnetic transducer with a desired track. The degree of accuracy with which the transducer can be positioned determines the spacing necessary between the center of adjacent tracks and thereby largely influences the storage efficiency, i.e, number of characters per unit of area of the memory. In an attempt to increase the accuracy of alignment, servo systems of various types have been proposed for servoing the transducer onto the tracks. These systems have generally employed positioning information in the form of servo signals interspersed with the data in the recording surface (called sector servo) or reference patterns permanently recorded on a disk surface. Those systems which employ a separate dedicated servo surface have required a servo transducer to read the positioning information on this surface and one or more separate data transducers ganged thereto. This inherently militates against high storage efficiencies because of the stack-up of mechanical tolerances in the ganged transducers. In systems using sector servo, the same head can be used to read both the data and the interspersed servo information, but because of the high frequency sampling required for accurate positioning, such systems do not provide the desired accuracy unless a considerable portion of the available disk surface is given over to the storage of positioning information.

As an alternate to servo systems employing separate servo sectors or servo surfaces, the so-called buried servo has been employed. In one form of such a servo, a disk having two magnetic layers is used, the lower layer containing a recorded servo pattern and the upper layer containing the recorded data, with the lower servo layer having a considerably higher coercivity than the upper layer so as to avoid erasure of the servo information while recording data on the upper surface.

In an alternate embodiment of buried servo, only a single magnetic layer is employed and the servo information is recorded thereon with a special recording head. The top portion of this layer is erased to erase the servo information in this top portion. Data is then recorded in this top portion by a thin film head which does not affect the servo information recorded in the bottom portion of the magnetic layer.

For continuous servoing from such prerecorded servo information with only one recording head, which is used simultaneously for reading the servo and for data writing or data reading, the system must have three modes of operation. These are reading servo while (1) reading data, or (2) while writing data or (3) while neither reading nor writing data. Clearly the second mode of operation, reading servo while writing data, presents the most serious problem. To prevent the write signal from appearing in the servo readback channel, prior systems have used write and servo filters that have a very high stop band attenuation, only little pass band attenuation and consequently very steep filter slopes.

PRIOR ART

U.S. Pat. No. 3,404,392 shows a buried servo system using servo signals of different frequencies F1 and F2 and employing filter networks to separate servo information from data.

THE INVENTION

This invention proposes a unique solution to the separation of the data write signal from the servo readback signal, both of which appear across the same head, without requiring frequency selective methods such as filtering.

In the present invention, the use of such filters is avoided by employing a number of different methods to effectively cancel the read-write head voltage so that the servo signal can be extracted for track following purposes.

DESCRIPTION OF THE DRAWINGS

FIGS. 1A and 1B represent a prior art circuit and its electrical equivalent used for buried servo detection.

FIGS. 2A and 2B are circuit diagrams of two embodiments of the present invention using impedances as a collector load; and FIGS. 3A and 3B illustrate alternate embodiments of the invention using transformers as a collector load.

BEST MODE EMBODIMENT AND INDUSTRIAL APPLICABILITY

In FIG. 1A, a commonly used prior art driver stage is shown which drives a recording head 11 with a current Iw consisting of data write current and AC bias current (in the case of AC biased recording). As shown in FIG. 1B, the head can be represented by its impedance Zh in series with a voltage source Vs which represents the readback servo signal.

In the read-servo-while-write data mode of operation, the data write current causes a voltage Vw across head 11 equal to IwZh. This write voltage Vw is several orders of magnitude larger than the servo read back voltage Vs. To retrieve the servo signal from the much larger data signal by means of filtering causes almost insurmountable problems.

Instead of filtering, this invention retrieves the servo signal Vs by means of compensation. To accomplish this compensation, a second equally large write voltage Vw is generated, which is subtracted from the voltage Vw+Vs across the head so that only Vs remains. An alternative is to generate a 180° out-of-phase signal −Vw and add this to the voltage across the head to obtain Vs.

In FIGS. 2A and 2B, two possible realizations of servo signal retrieval by means of compensation are shown. Both embodiments make use of an electrical impedance Zh' which will be referred to as dummy head impedance. This impedance can be realized by electrical components or by the impedance of the coil of a dummy recording head. In FIG. 2A, a bridge-type compensation of the voltage Vw across the head is shown. With the two auxiliary impedances Z1 and Z2, the bridge is balanced so that no write signal appears in the servo output at terminals 12. This is the case if Z1Zh'=Z2Zh. Impedances 15 form the collector load for this circuit. A disadvantage of this circuit is that at the servo output a voltage of at most ½Vs appears, namely if Zh=Zh' and Z1=Z2. An advantage is that only one driver stage, including transistors 9 and source 10, is needed.

The embodiment shown in FIG. 2B employs two drivers, represented by transistors 13, 13' and sources 14, 14', driven in opposite phase. Here the servo output appearing at terminals 16 is equal to Vs when Zh'=Zh.

A disadvantage of the circuit of FIG. 2B is that the degree of compensation depends on the matching of the parameters of active devices (transistors 13 and 13'). For a precise compensation, passive components should be used because of their better parameter matching and their greater time stability. Using small transformers, either discrete elements or transformers realized in thin film technology, and possibly integrated with a thin film recording head, several other realizations can be developed.

There are advantages in using a transformer load as a collector load for the driver stage instead of two impedances. This is shown in FIG. 3A where a transformer 19 has a primary winding 19a connected as shown and a center-tapped secondary winding 19b. The secondary of transformer 19 can then be used for write signal compensation. Only the servo output signal appears across terminals 21, giving ½Vs at its output when Zh'=Zh.

In FIG. 3B, a balanced driver with a transformer collector load is shown which gives a servo output equal to Vs. This embodiment employs two transformers 22, 23, each having a primary winding 22a, 23a and secondary windings 22b, 23b connected as shown, with the full servo output signal appearing across terminals 24 when Zh'=Zh.

Using the present invention, the prior art filtering can be traded in for compensation. The filter specifications are alleviated as the degree of compensation increases. The compensation that can be obtained depends on the type of circuit employed and ranges from 40 to 60 db.

I claim:

1. In a track following servo system for a magnetic record member in which servo information is recorded underneath data information on the magnetic record member, and the same magnetic transducer is used to simultaneously read the servo information and write the data information, the transducer having a predetermined impedance characteristic, the improvement comprising:

impedance means having an impedance characteristic matching said predetermined impedance characteristic of said transducer, circuit means connecting said impedance means to the output of said magnetic transducer, and servo output means connected to said circuit means to produce a servo output signal in which the voltage generated in said transducer during the writing of data information is effectively cancelled due to the presence of said impedance means.

2. Apparatus in accordance with claim 1, in which said circuit means includes a bridge circuit containing said transducer and said impedance means, said servo output signal appearing at the output terminals of said bridge circuit for use in said system.

3. Apparatus in accordance with claim 2, in which said bridge circuit contains said transducer in one arm, said impedance means in an adjacent arm, and second and third impedance means in the other two arms, said servo output signal appearing across the junction between said transducer and said impedance means and the junction between said second and said third impedance means.

4. Apparatus in accordance with claim 1, in which said circuit means includes a pair of driver means driven in opposite phase to each other.

5. Apparatus in accordance with claim 1, in which said transducer and said impedance means are connected serially and said circuit means includes a transformer having a primary winding having a terminal connected to said transucer and having a secondary winding connected across said transducer and said impedance means.

6. Apparatus in accordance with claim 5, in which said servo output signal appears between the other terminal of said primary winding and the junction between said transducer and said impedance means.

7. Apparatus in accordance with claim 1, in which said circuit means includes a pair of transformers having primary and secondary windings, the primary windings of one of said transformers being connected across said transducer, the primary winding of the other transformer being connected across said impedance means, said secondary windings being connected together serially.

* * * * *